United States Patent
Tsironis

(10) Patent No.: US 8,854,162 B1
(45) Date of Patent: Oct. 7, 2014

(54) METHOD FOR PREVENTING ELECTRICAL SHORT IN IMPEDANCE TUNERS USING MECHANICAL STOP

(71) Applicant: Christos Tsironis, Kirkland (CA)

(72) Inventor: Christos Tsironis, Kirkland (CA)

( * ) Notice: Subject to any disclaimer, the term of this patent is extended or adjusted under 35 U.S.C. 154(b) by 0 days.

(21) Appl. No.: 13/851,565

(22) Filed: Mar. 27, 2013

Related U.S. Application Data

(63) Continuation-in-part of application No. 12/805,897, filed on Aug. 24, 2010, now Pat. No. 8,461,946.

(51) Int. Cl.
*H03H 7/38* (2006.01)

(52) U.S. Cl.
CPC ........................................ *H03H 7/38* (2013.01)
USPC .......................................... 333/263; 333/17.3

(58) Field of Classification Search
USPC ..................... 333/17.3, 32, 33, 263
See application file for complete search history.

(56) References Cited

U.S. PATENT DOCUMENTS

| | | |
|---|---|---|
| 6,674,293 B1 | 1/2004 | Tsironis |
| 7,280,012 B2 | 10/2007 | Boulerne |
| 7,589,601 B2 | 9/2009 | Simpson |

*Primary Examiner* — Stephen Jones

(57) ABSTRACT

Mechanical vertical stops, in form of metallic or plastic screws or dowel pins are introduced as permanent limits and attached on the tuning probes or the vertical axis of slide screw impedances tuners; the vertical stops are adjusted in order to prevent the probes from getting closer to the center conductor than a certain limit; this limit is calculated to prevent corona discharge at a specified maximum RF power and a required maximum reflection factor (Gamma). The adjustment method uses measured data of Gamma as a function of the vertical position of the probe to estimate and adjust for the requested gap to be maintained between the probes (at their lowest position) and the center conductor at any given RF power. The technique can be used in automatic, stepper controlled, as well as in manual, micrometer screw controlled, tuners.

4 Claims, 23 Drawing Sheets

Using vertical screw on the axis to stop the probe from touching the center conductor

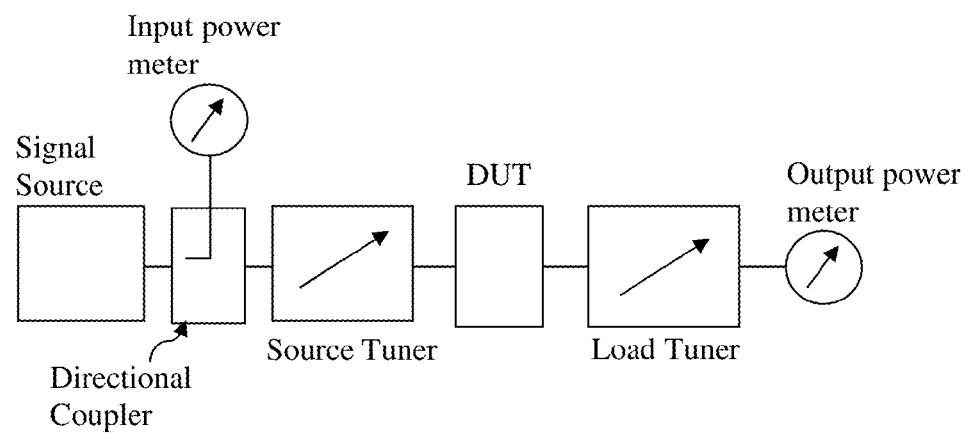
FIGURE 1: Prior art, Load Pull measurement setup

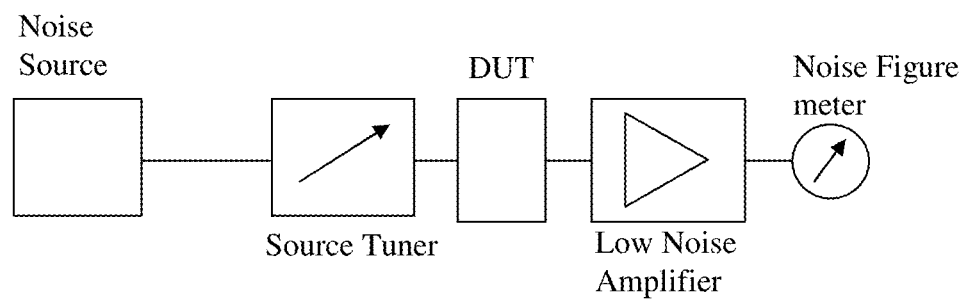
FIGURE 2: Prior art, Noise measurement setup

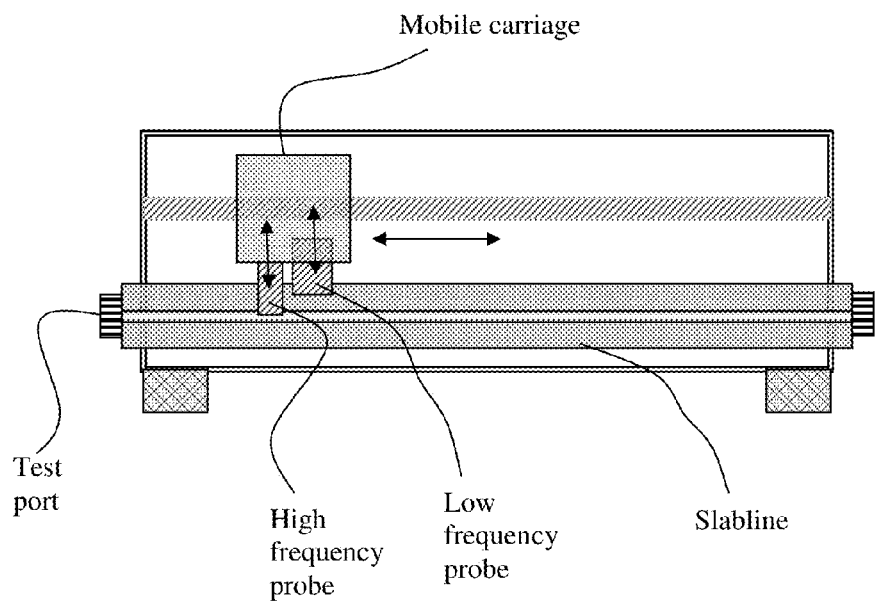
FIGURE 3: prior art, schematics of slide screw impedance tuner using two probes in the same carriage

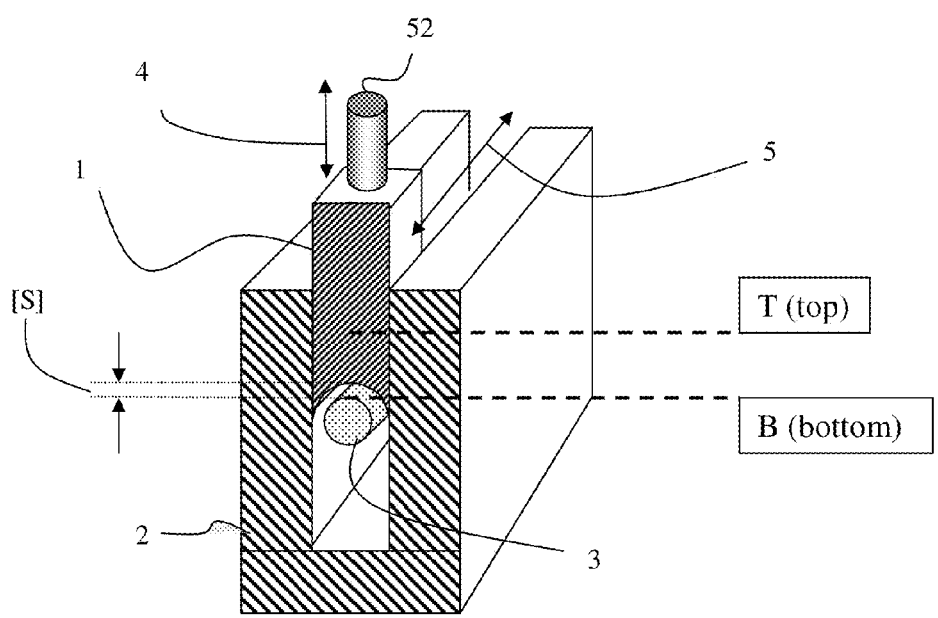
FIGURE 4: Prior art, cross section of RF probe in a slabline of a slide screw impedance tuner

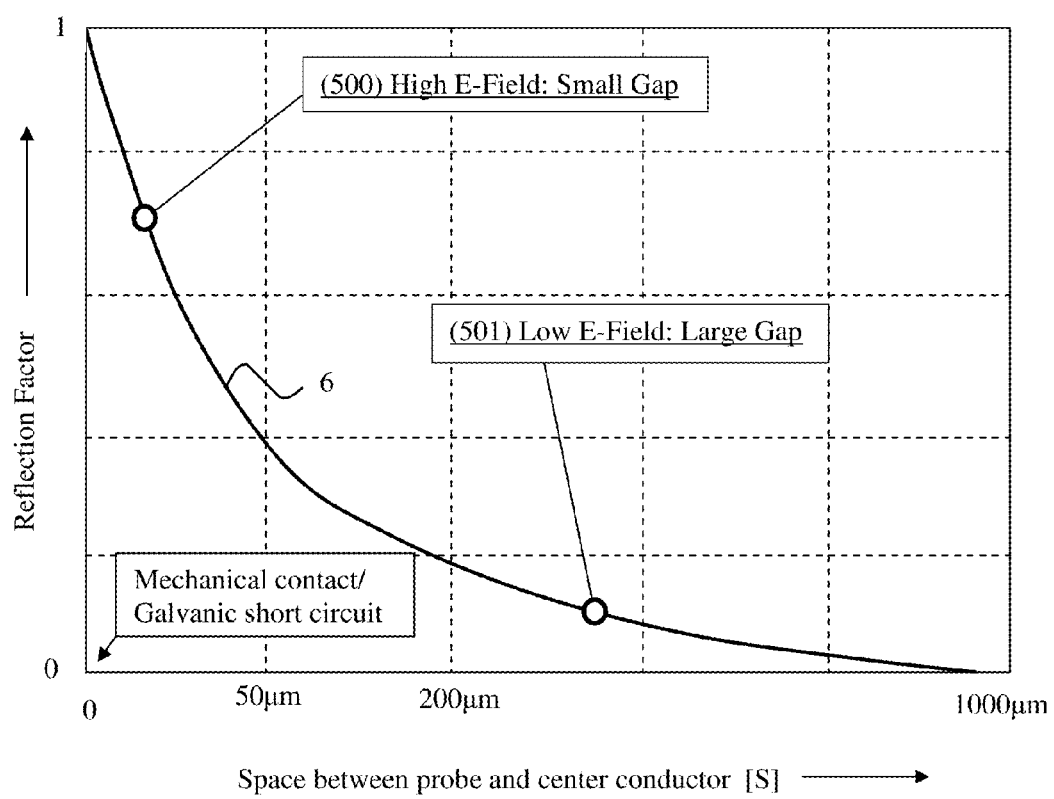
FIGURE 5: Prior art, dependence of reflection factor from distance 'probe-center conductor'

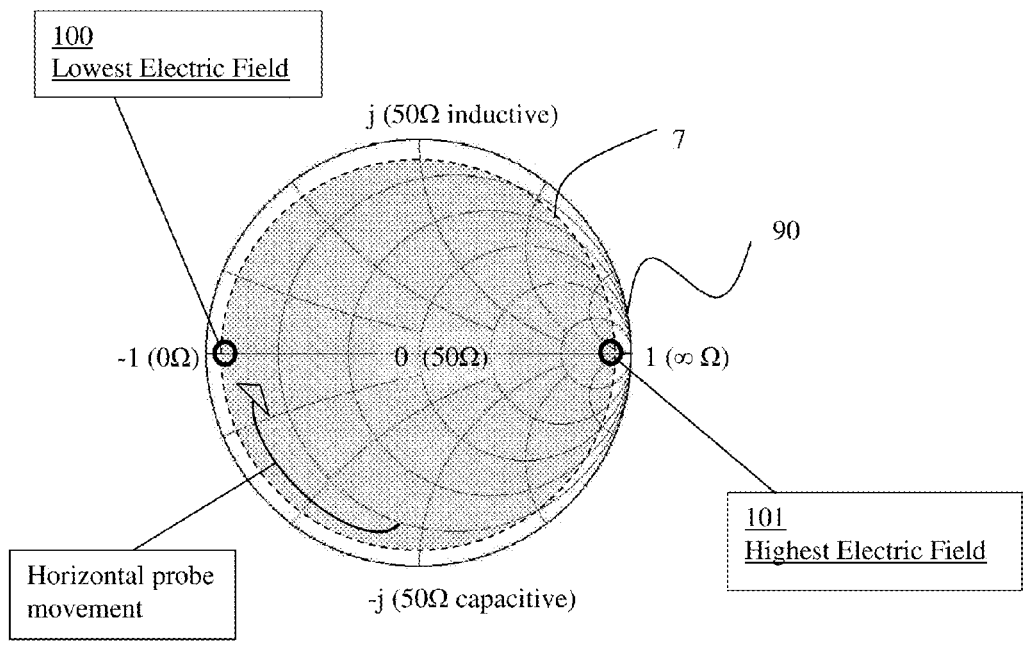
FIGURE 6: Prior art, Smith chart showing the maximum reflection factor of a slide screw tuner

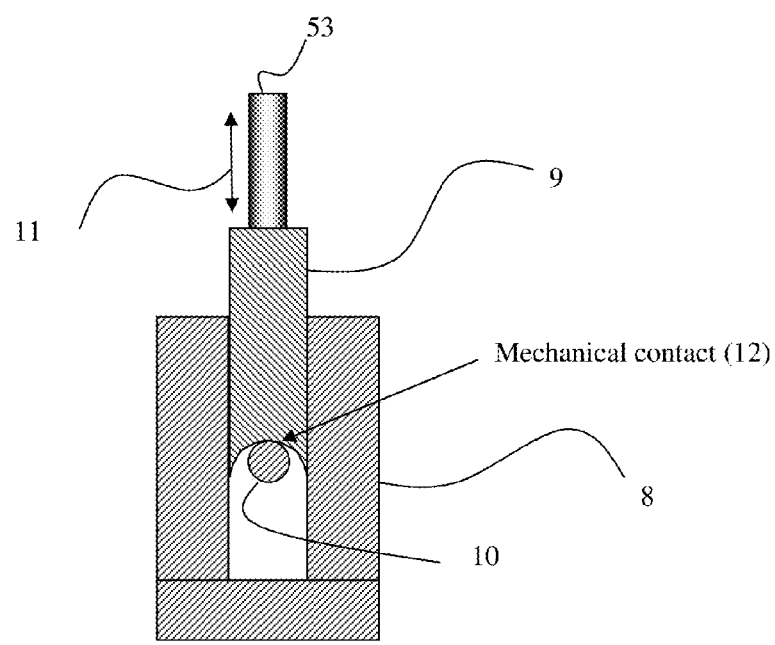
FIGURE 7: Prior art, cross section of RF probe making mechanical (galvanic) contact with the center conductor

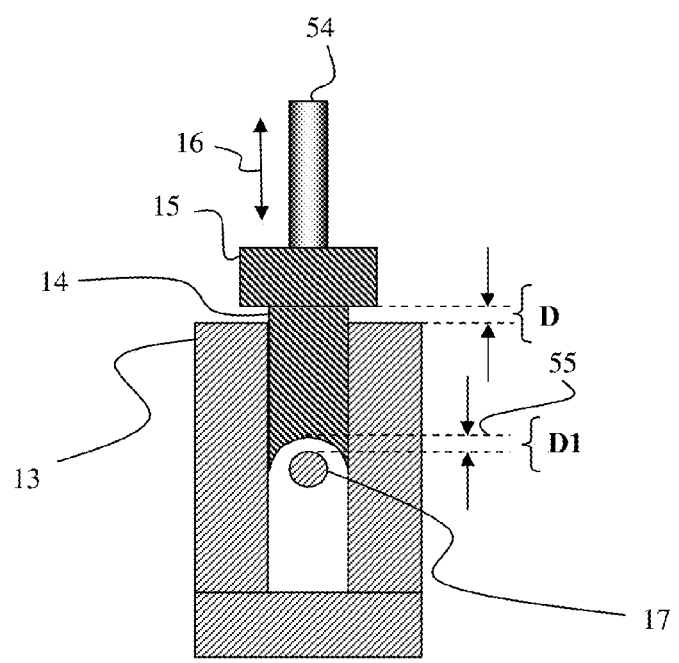
FIGURE 8: Protecting the probe from moving closer to center conductor using T-type stops on the probes

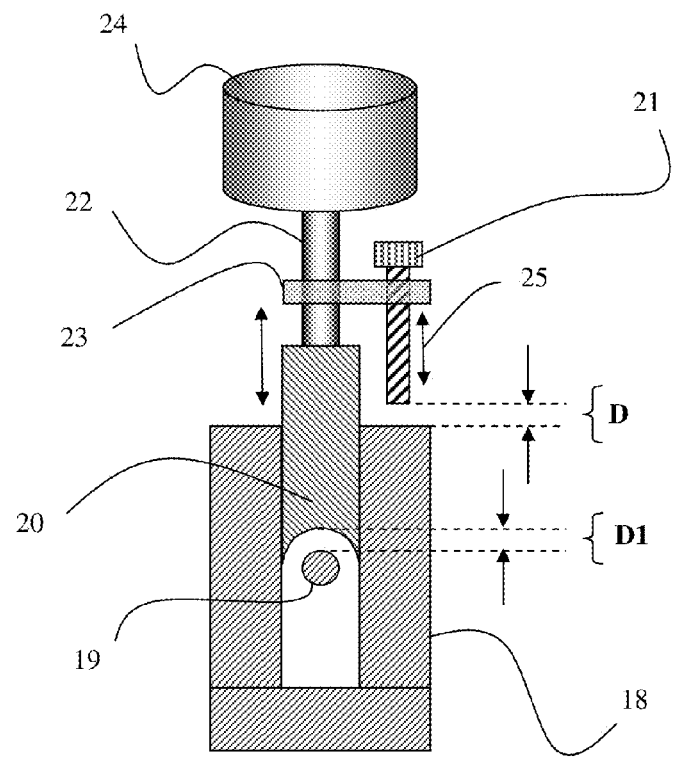
FIGURE 9: Using vertical screw on the axis to stop the probe from touching the center conductor

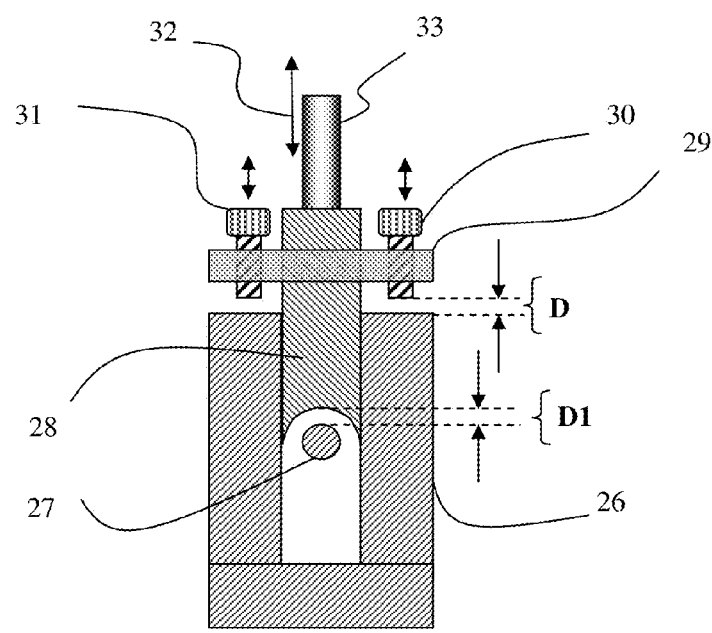
FIGURE 10: Using vertical screws on the probe to prevent mechanical contact between probe and center conductor

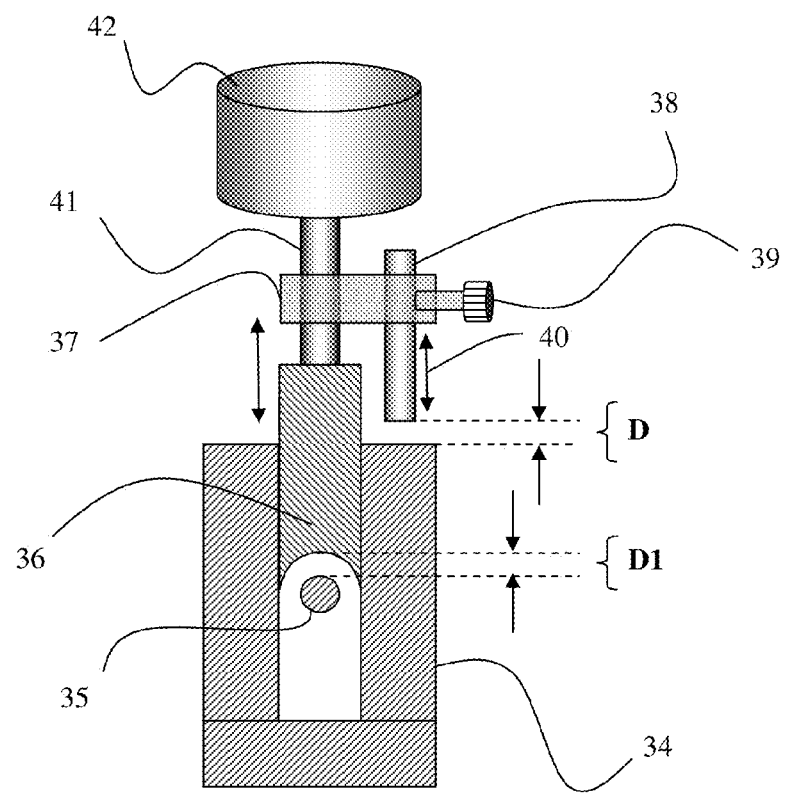
FIGURE 11: Using adjustable dowel pin on the axis to prevent mechanical contact between probe and center conductor

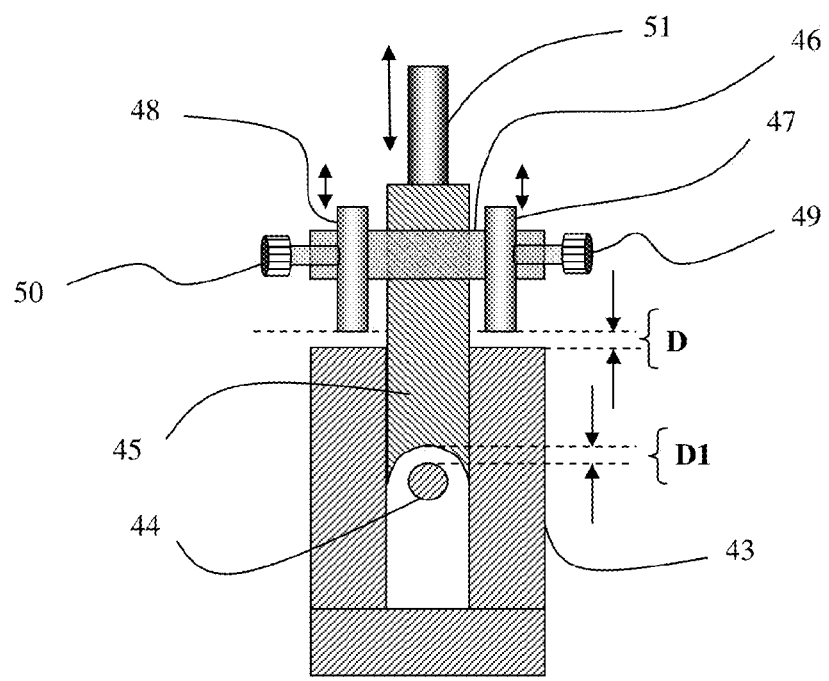
FIGURE 12: Using adjustable dowel pins to prevent mechanical contact between probe and center conductor

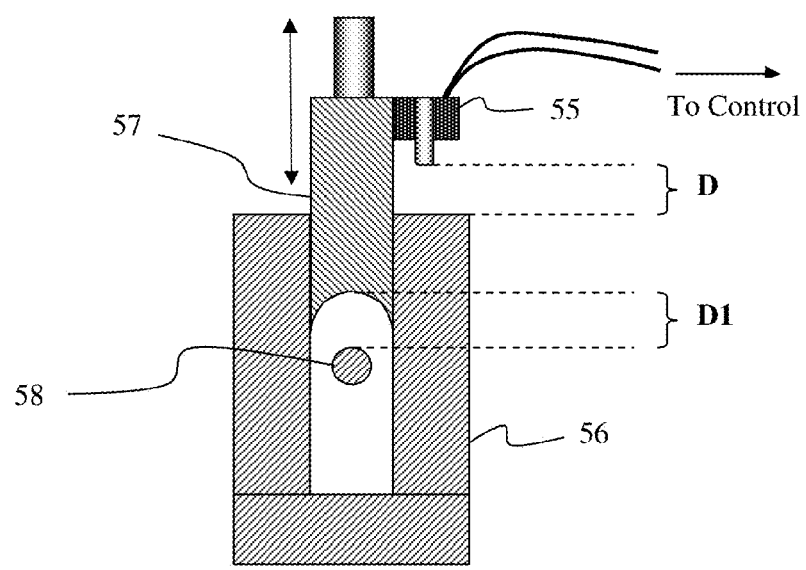
FIGURE 13: Prior art, proximity switch preventing mechanical contact between probe and center conductor

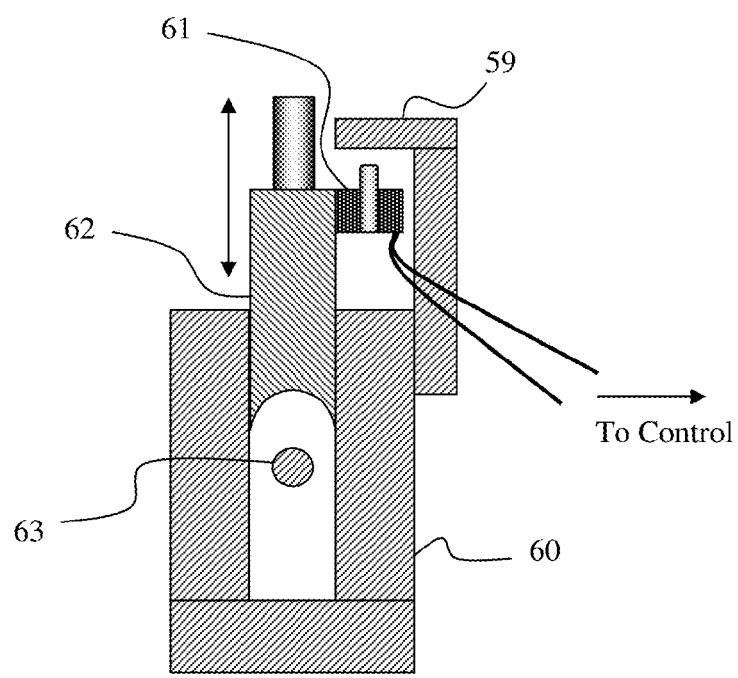
FIGURE 14: Prior art, zeroing (initialization) switch

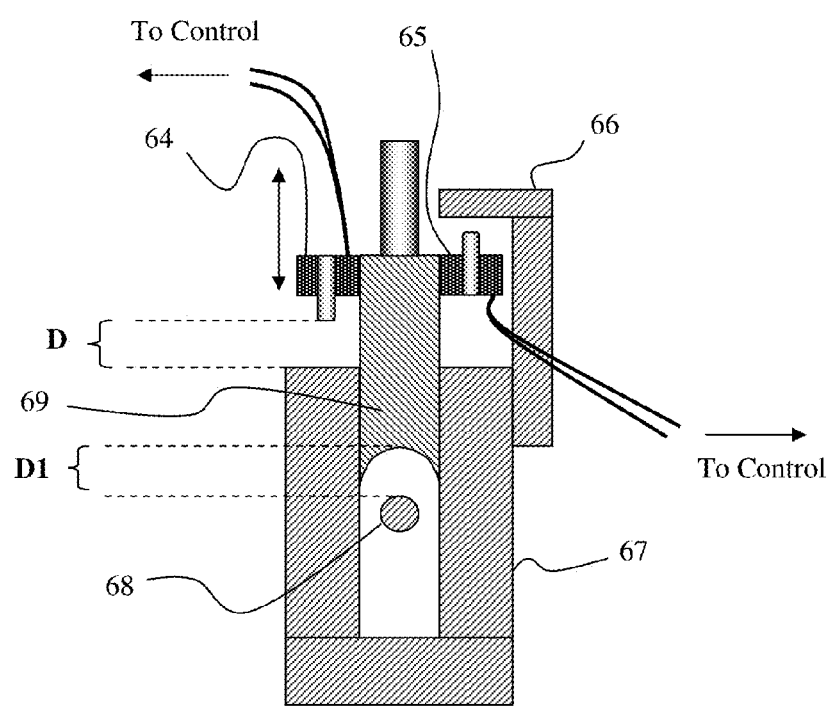
FIGURE 15: Prior art, combination of initialization and proximity limit switch

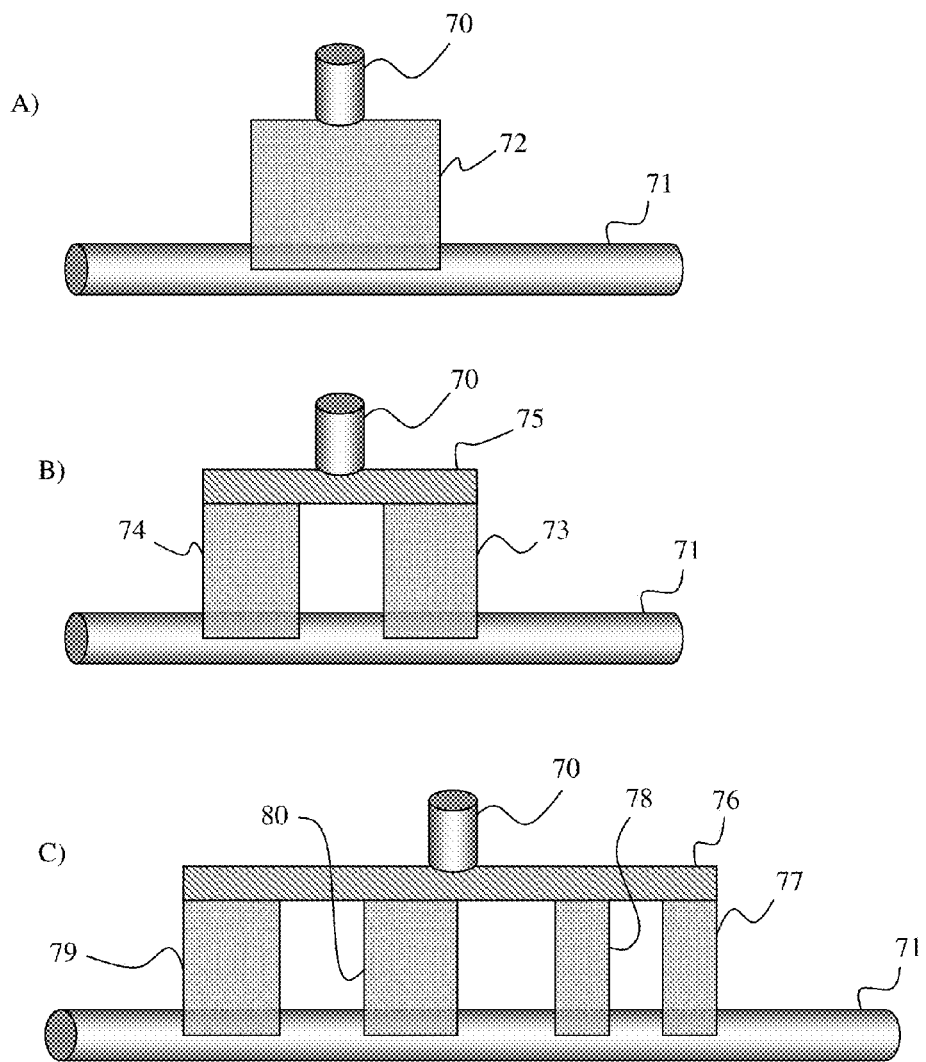
FIGURE 16A-C: Prior art, RF tuner probes with single and multiple conductive sections

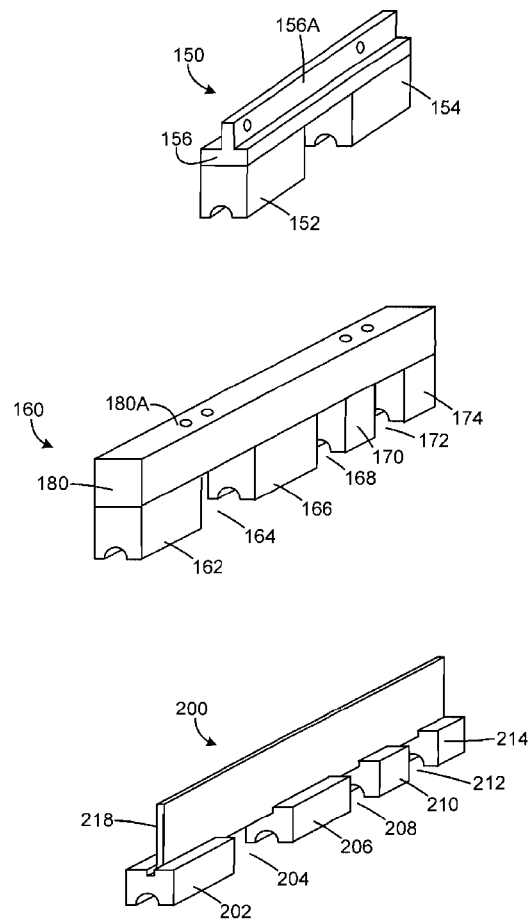
FIGURE 17, Prior art, multiple section probes on which mechanical stops are applicable

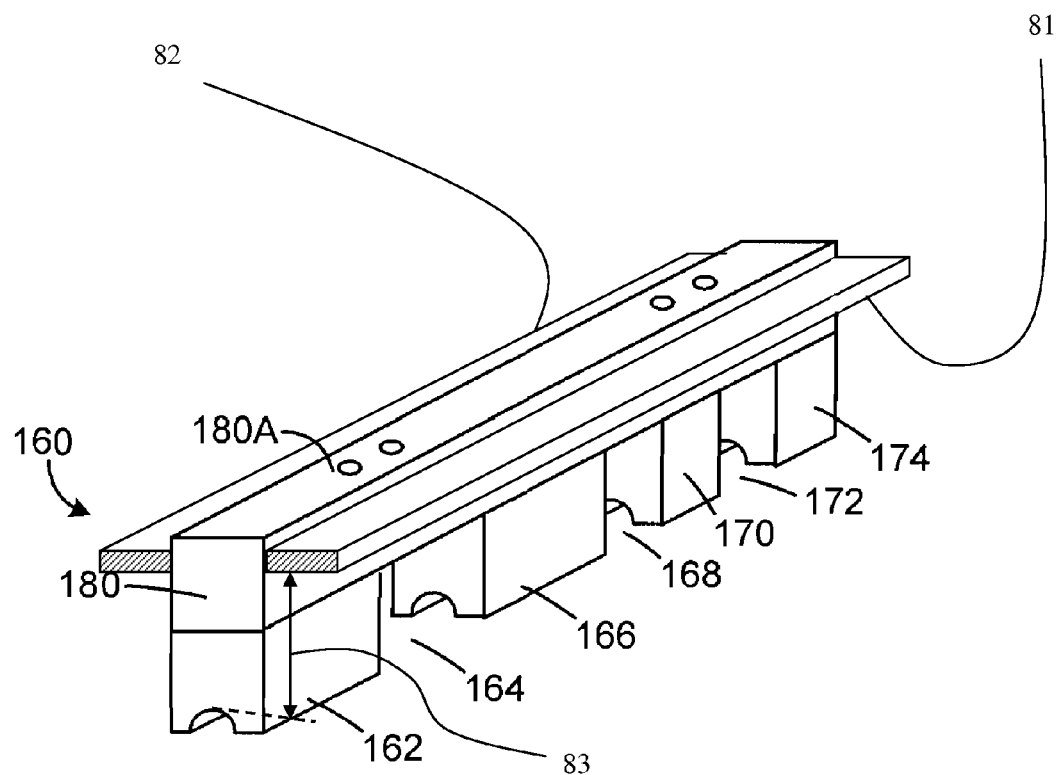
FIGURE 18: Example of implementation of mechanical means of contact prevention on prior art multi-section probes

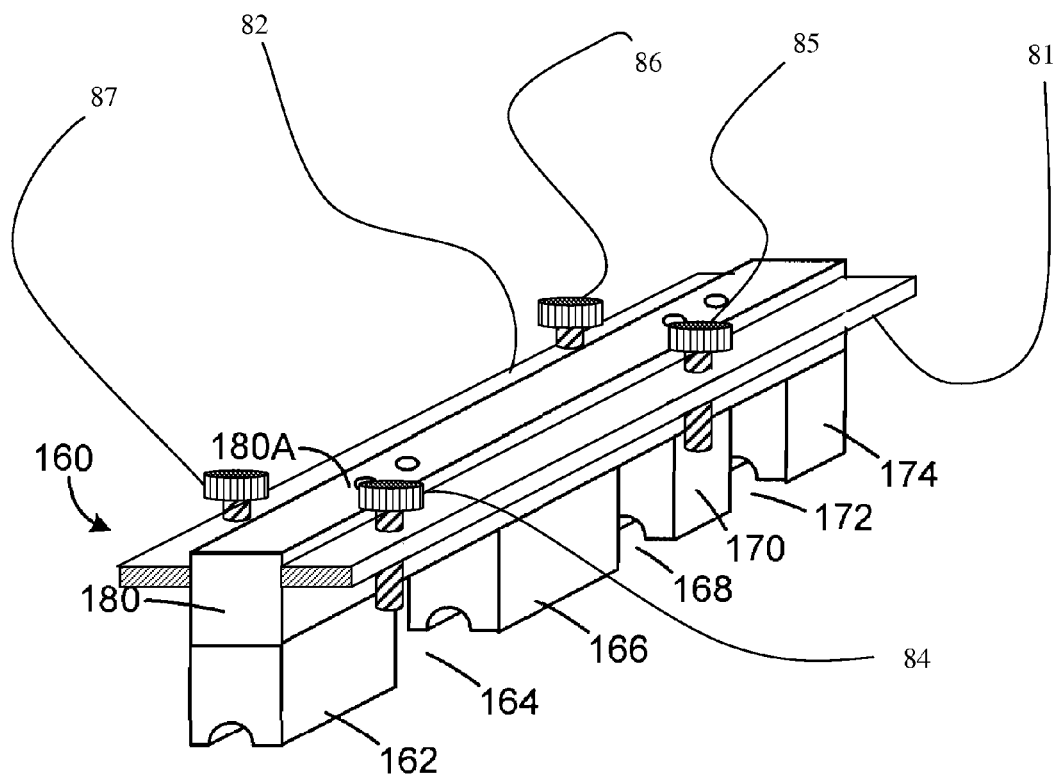
FIGURE 19: Implementation of adjustable mechanical means of contact prevention on prior art multi-section probes

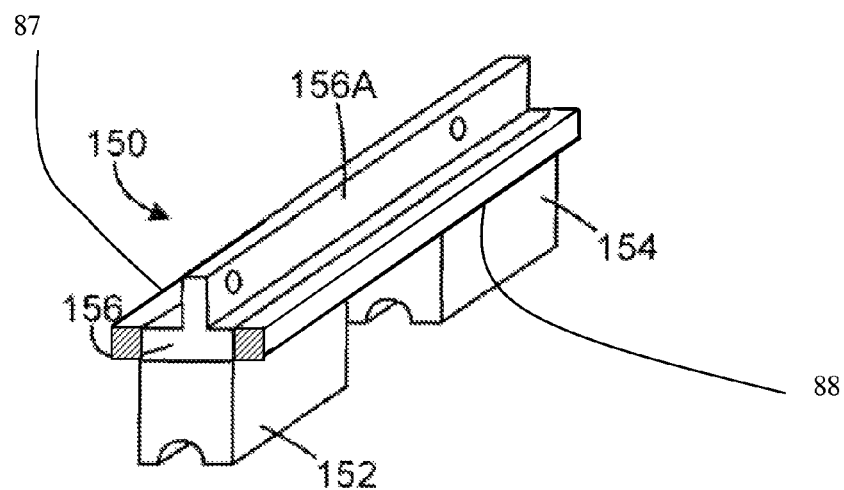
FIGURE 20: Implementation of permanent mechanical means of contact prevention on prior art multi-section probes

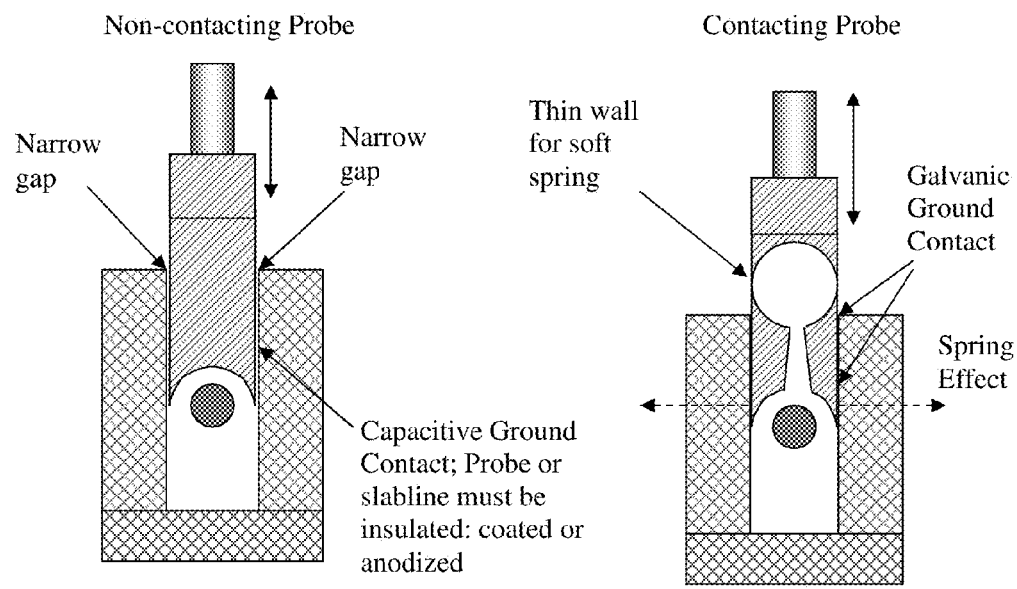
FIGURE 21: Prior art, cross sections and comparison between contacting and non-contacting tuner probes

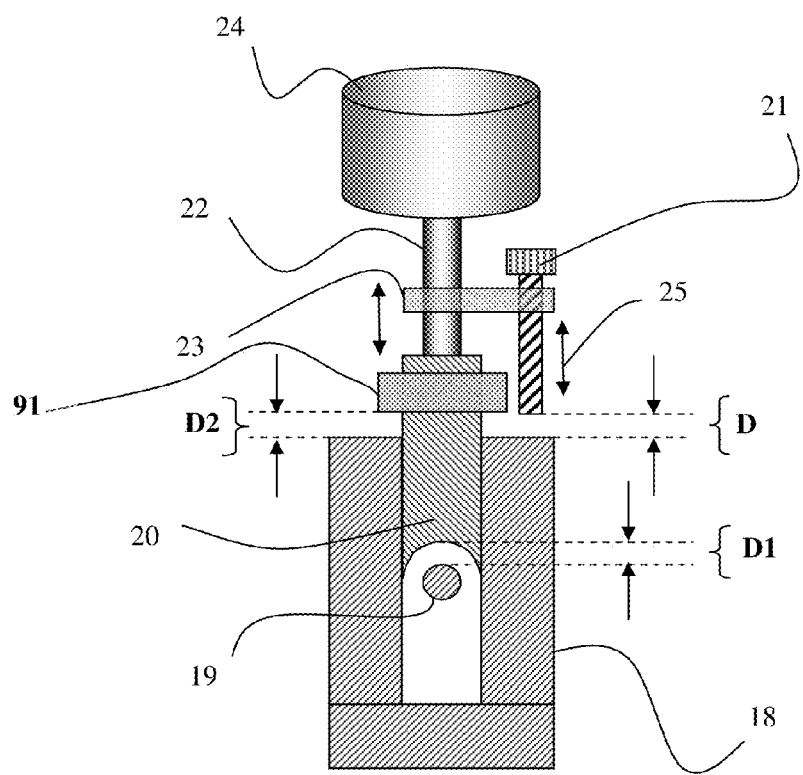
FIGURE 22: Combination of permanent and adjustable obstacles of vertical probe movement.

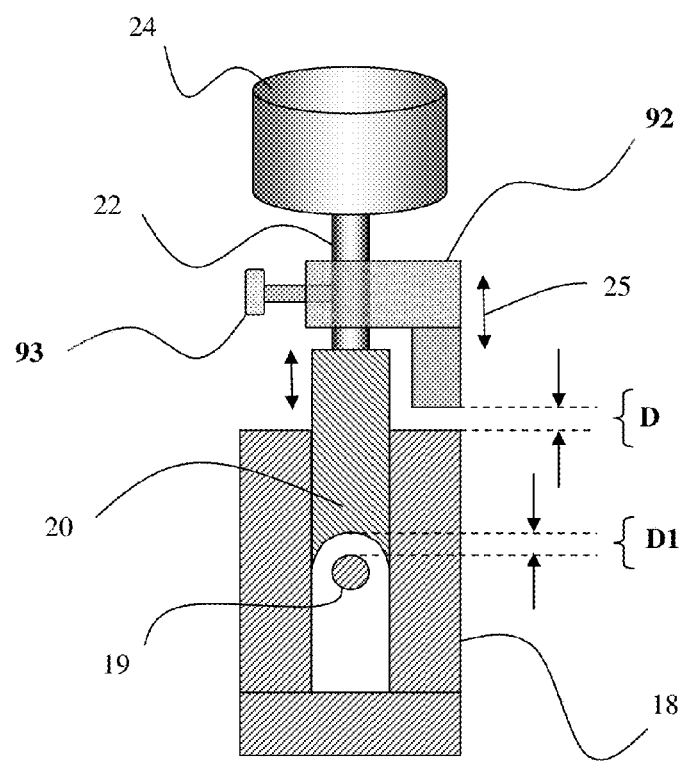
FIGURE 23: Adjustable mechanical obstacle of vertical probe movement mounted on vertical axis.

METHOD FOR PREVENTING ELECTRICAL SHORT IN IMPEDANCE TUNERS USING MECHANICAL STOP

PRIORITY CLAIM

This application is a continuation of application Ser. No. 12/805,897, filed on Aug. 24, 2010 which claims the benefit of U.S. Provisional Application No. 61/282,976 filed on May 3, 2010, hereby incorporated by reference.

CROSS-REFERENCE TO RELATED ARTICLES

[1] Computer Controlled Microwave Tuner—CCMT; Product Note 41, Focus Microwaves, January 1998.
[2] http://www.microwaves101.com/encyclopedia/loadpull.cfm#definitions
[3] On-Wafer Noise Parameter Measurements using Cold-Noise Source and Automatic Receiver Calibration; Application Note 19, Focus Microwaves, January 1999.
[4] Tsironis, U.S. Pat. No. 6,674,293, Adaptable pre-matched tuner system and method.
[5] Simpson, U.S. Pat. No. 7,589,601, Impedance Tuner Systems and Probes.
[6] Bouleme, U.S. Pat. No. 7,280,012, Multi-probes as single RF tuning element for slide screw tuners.
[7] Why are Maury tuners better?: http://www.maurymw.com/dc_ent.htm
[8] Corona discharge, Wikipedia, http://en.wikipedia.org/wiki/Corona_discharge
[9] Breakdown field in air/vacuum, Wikipedia, http://en.wikipedia.org/wiki/Dielectric_strength#Breakdown_field_strength
[10] http://www.microwaves101.com/encyclopedia/vswr.cfm

STATEMENT REGARDING FEDERALLY SPONSORED RESEARCH OR DEVELOPMENT

Not Applicable

REFERENCE TO SEQUENCE LISTING, A TABLE, OR A COMPUTER PROGRAM LISTING COMPACT DISC APPENDIX

Not Applicable

BACKGROUND OF THE INVENTION

This invention relates to automatic impedance tuners used in load pull testing of power transistors and noise testing of low noise transistors; said tuners allow synthesizing appropriate RF reflection factors (or complex impedances) at the input and output of said transistors [1].

A popular method for testing and characterizing RF components (transistors) for high power or low noise operation is "load pull" and "source pull". Load pull or source pull are automated measurement techniques used to measure Gain, Power, Efficiency and other characteristics of the DUT, employing source and load impedance tuners and other test equipment, such as signal sources, directional couplers, test fixtures to house the DUT (device under test, typically an RF transistor) and input and output power meters (FIG. 1) [2]. To measure noise figure and noise parameters of a low noise device a similar setup is used (FIG. 2), in which the signal source is replaced by a calibrated standard noise source and the power meter by a sensitive noise figure analyzer, following a signal amplifying, low-noise amplifier [3]. The tuners in particular are used in both setups, in order to manipulate the RF impedance conditions under which the DUT is tested.

A popular family of electro-mechanical (automated) tuners are the "slide-screw tuners" shown schematically in FIG. 3. Slide screw tuners comprise a slotted low loss airline (slabline) with a test port adjacent to the DUT, one or more remotely controlled mobile carriages, which can travel parallel to the axis of said slabline, and carry one or more RF probes each [4]. FIG. 4 shows schematically a perspective cross section of a slabline (2) and a tuner probe. Said probes (1) are insertable (4) into and can slide inside the slot of the slabline. The probes can also move horizontally (5) parallel to the center conductor (3). Typically all probes (1, 9, 14, 20, 28, 36, 45) disclosed in this invention and shown in FIGS. 4, 7, 8, 9, 10, 11, 12, correspondingly, are made of conductive material and are attached to vertical axes (52, 53, 54, 22, 33, 41, 51) [4, 5, 6]. Said vertical axes are driven by stepper motors and allow very accurate positioning control of the distance between the probes and the center conductor of the slablines [S] in FIG. 4. Wide probes are used for low frequencies, narrow probes for high frequencies. The probes have a concave bottom so that they create high capacitive coupling with the center conductor and insert a conductive body between the center conductor and the sidewall of the slabline, where most of the electric field is concentrated.

DESCRIPTION OF PRIOR ART

Each mobile carriage of said tuner comprises one or two vertical axes, which are driven by appropriate gear mechanism manually or by remotely controlled electrical motor. Each vertical axis holds one conductive RF probe (1), FIG. 4, which is dimensioned such as to slide inside the slot of said airline (or slabline (2) and be positioned at various distances from the center conductor (3) of said slabline [4, 5, 6]. The RF probes (1) have a concave channel at their bottom close to the center conductor (3) and are dimensioned such as to slide-fit over said center conductor. Said probes have a length, parallel to the axis of said airline, which depends on the frequency of operation of said impedance tuner: short RF probes cover higher frequencies whereas long RF probes operate better at low frequencies. Coupling between the probes (1) and the center conductor (3) is capacitive and ground contact between said RF probes and the body of the airline (2) is either capacitive or galvanic (FIG. 21). Said capacitive contact is established by dielectric coating or anodizing the RF probes and/or anodizing the airline, depending on whether item is made of material that can be anodized, such as Aluminum. Moving the probe horizontally along the slabline (5) allows changing the phase of the reflection factor.

The probe (1), FIG. 4, of said slide screw tuner is attached to a vertical axis (52) and can be moved vertically (4) between a high position (Top) and a low position (Bottom). The high position is selected such that the probe does not interfere noticeably with the electric field between center conductor (3) and the lateral walls of the slabline (2), the low position being such that a required reflection factor of the signal flow is obtained ((6), FIG. 5) [4]. If the probe (1) makes galvanic contact with the center conductor (3), creating a short circuit'", then the signal flow through the tuner stops, measurements are meaningless and, under circumstances, the DUT may be damaged, especially if there is a DC voltage applied at this point through the tuner center conductor (3). If the probe has a protective coating on the concave surface facing the center conductor (FIG. 4), then a mechanical contact between the probe and the center conductor does not necessarily mean also a galvanic contact and short circuit, but it is to be avoided nevertheless. Since the center conductor of the slabline has some elasticity, temporary mechanical contacts are not damaging the tuner or alter its performance, but should not be part of normal operation. If, by control failure, human error or intentionally, the motor controlling the position of the vertical axis, is directed to step beyond the closest distance allowed, a short circuit, or mechanical contact, between probe and center conductor will occur. In order to avoid this event a mechanical stop must be introduced. This can be done in a matter of different ways.

FIG. 5 shows the reflection factor created by tuner probe at the tuner test port (FIG. 3) as a function (6) of the gap between said probe and center conductor [S]. If [S] becomes zero then we have mechanical contact between probe and center conductor and if the probe does not have insulating protective coating at its lower surface then we have also galvanic contact (short circuit). At short circuit the tuner loss becomes infinite and there is no power transfer from the test port to the output port of the tuner. The tuning operation is meaningless. Normal tuning operation is between a reflection factor close to zero (maximum value of [S]) and maximum reflection factor (minimum value of [S]). Exact values of minimum [S] depend on maximum reflection factor requirements, but also from frequency and probe size. Typical operational values can reach reflection factors up to 0.95 at typical [S] of the order of 0.1 mm; these values are not exact; they depend on frequency, probe size and insulation coating of the probes and are difficult to estimate.

FIG. 6 shows the tuning range of said tuners on a Smith Chart (90). Maximum possible tuning range is 1 but capacitance values between probe and center conductor and insertion losses in the slabline between test port and probe location (FIG. 3) limit said tuning range to a maximum value, as shown by the shaded area (7) [4].

BRIEF DESCRIPTION OF THE DRAWINGS

The invention and its mode of operation will be better understood from the following detailed description when read with the appended drawings in which:

FIG. 1 depicts prior art, Load Pull measurement setup.

FIG. 2 depicts prior art, Noise measurement setup.

FIG. 3 depicts prior art, schematics of slide screw impedance tuner using two probes in the same carriage.

FIG. 4 depicts prior art, cross section of RF probe in a slabline of a slide screw impedance tuner.

FIG. 5 depicts prior art, dependence of reflection factor from distance 'probe-center conductor'. The markers (100) and (101) indicate reflection factor (f) values and associated distance between probe and center conductor, which correspond to associated RF power.

FIG. 6 depicts prior art, Smith chart showing the maximum reflection factor of a slide screw tuner. Markers (100) and (101) indicate areas of low (100) and high (101) resistance generated by horizontal-only movement of the tuner probe.

FIG. 7 depicts prior art, cross section of RF probe making mechanical (galvanic) contact with the center conductor.

FIG. 8 depicts protecting the probe from moving closer to center conductor using T-type stops on the probes.

FIG. 9 depicts using vertical screw on the axis to stop the probe from touching the center conductor.

FIG. 10 depicts using vertical screws on the probe to prevent mechanical contact between probe and center conductor.

FIG. 11 depicts using adjustable dowel pin on the axis to prevent mechanical contact between probe and center conductor.

FIG. 12 depicts using adjustable dowel pins to prevent mechanical contact between probe and center conductor.

FIG. 13 depicts prior art proximity switch preventing mechanical contact between probe and center conductor.

FIG. 14 depicts prior art zeroing (initialization) switch.

FIG. 15 depicts prior art combination of initialization and proximity limit switch.

FIG. 16 depicts prior art RF tuner probes with single and multiple conductive sections.

FIG. 17 depicts prior art multiple section probes on which mechanical stops are applicable.

FIG. 18 depicts example of implementation of mechanical means of contact prevention on prior art multi-section probes.

FIG. 19 depicts implementation of adjustable mechanical means of contact prevention on prior art multi-section probes.

FIG. 20 depicts implementation of permanent mechanical means of contact prevention on prior art multi-section probes.

FIG. 21 depicts prior art, cross sections and comparison between contacting and non-contacting tuner probes.

FIG. 22 depicts a combination of permanent and adjustable obstacles of vertical probe movement.

FIG. 23 depicts adjustable mechanical obstacle of vertical probe movement mounted on vertical axis.

DETAILED DESCRIPTION OF THE INVENTION

FIG. 7 shows the prior art situation, where said probe (9) is attached on a vertical axis (53) and is movable vertically (11) inside the slabline (8) but does not have any direct mechanical means for preventing mechanical contact (12) with the center conductor (10). Alternative methods for avoiding mechanical contact have been used and are all indirect (FIGS. 13, 14, 15); they introduce either an opto-electronic or electro-mechanical limit switch (55) such as to instruct the motor control to stop lowering the probe (57) when the probe reaches a pre-defined closest position to the center conductor (58), FIG. 13; in this case the distance D between the tip of said switch (55) and the top of said slabline (56) is chosen smaller than the distance D1 between the bottom of the probe (57) and the top of the center conductor (58). In FIG. 14 a switch (61) is used to "zero" the probe (62) at the highest position (59), count the motor steps until the bottom position is reached and instruct the software control to stop before the probe (62) touches the center conductor (63) [1, 4]. In FIG. 15 two switches (64, 65) are used to zero the probe (69) at the highest (66) and the lowest (67) position, choosing D<D1 and instructing the electronic control and motor firmware to avoid contact between said probe (69) and center conductor (68) [7].

These prior art methods are all "indirect" and, even though they do, in general allow normal operation, they are not fail-safe. Either by human error, on purpose or by software or electronic error or failure, the signal from the limit switch may be interrupted, ignored by the control software or overridden and then the motor movement, descending the probe towards the center conductor, will not stop and mechanical contact (or short circuit) will occur. The mechanical limitation means described in this invention, however, are in addition to prior "indirect" zeroing and limiting techniques and do not allow mechanical contact, neither intentionally or if the controls fail.

Probes with mechanical means for preventing contact with the center conductor of said slablines are shown in FIGS. 8 to 12.

FIG. 8 shows a permanent and non-adjustable mechanical limitation means built on to each probe. The limitation is made in form of a "T" shoulder (15) and is built-in permanently on the probe (14). The position of the T shoulder is chosen with respect with the highest level (55) of the concave surface of said probe (14), such as to allow for a distance D1 between said surface and center conductor to be larger than the distance D between T shoulder (15) and the top of said slabline (13). The dimensions are therefore chosen such that, when the probe (14) moves vertically (16) driven by axis (54), the shoulder (15) will hit the top of the slabline (13) just before the probe (14) makes contact with the center conductor (17). This will always prevent mechanical contact.

FIG. 9 shows a different, adjustable, embodiment of the invention: The probe (20) is attached to axis (22), which is driven vertically by the motor (24). A cross bar (23) is mounted on the axis (22) and a vertical screw (21) is inserted on said cross bar. Said vertical screw is adjusted (25) at a distance D from the top of the slabline (18) such as to be smaller than the distance D1 between center conductor (19) and probe (20). This way, when said probe (20) approaches the center conductor (19), the screw (21) will hit the top of the slabline (18) just before said probe (20) makes mechanical contact with the center conductor (19). Since the position of said screw (21) is adjustable (25), this mechanism allows for fine tuning of the tuner's reflection factor performance, up to its maximum value with its inherent limitations as outlined before.

FIG. 10 shows mechanical means of contact prevention using two vertical screws (30, 31) inserted into a cross bar (29), which is mounted on the tuner probe (28) itself. The vertical position of the screws is adjusted at a distance D from the top of the slabline (26), such as, when the probe is moved vertically (32) by the axis (33), the screws (30, 31) will hit the top of the slabline (26) just before the probe (28) makes contact with the center conductor (27). This embodiment ensures also balanced movement limitation and prevents possible tilting of the axis as it may be possible in the embodiment of the configuration in FIG. 9. The embodiment of FIG. 9 may also use two symmetrical screws, similar to FIG. 10. This mechanism also allows for fine tuning of the tuner's reflection factor performance, up to its maximum value with its inherent limitations as outlined before.

FIGS. 11 and 12 show tuner probe configurations with limiting means using dowel pins (rods) instead of adjustable screws. In FIG. 11 the screw (21) of FIG. 9 has been replaced by a dowel pin (38). This pin (38) is inserted in a cross bar (37) which is attached on to the vertical axis (41) driven by the motor (42). Said dowel pin (38) is secured on cross bar (37) using a set-screw (39). The vertical position (40) of said dowel pin (38) is adjusted and secured at a height such as to hit the top wall of the slabline (34) just before the probe (36) makes contact with the center conductor (35).

In FIG. 12 the screws (30, 31) of FIG. 10 are replaced by dowel pins (47) and (48). Said dowel pins are inserted in a cross bar (46) and secured by set screws (49) and (50) at such height as to hit the top wall of the slabline (43) just before said probe (45) makes contact with the center conductor (44) of said slabline.

The tuner probes described in FIGS. 8 to 12, which use one or more mechanical limits for preventing contact with the center conductor, can be used in all types of remotely controlled electro-mechanical or manually controlled slide screw tuners. Whether the vertical position of the axis is driven by motor or by hand it is useful to avoid a mechanical or galvanic contact and short circuit of the probe with the center conductor. In particular, when the axis is controlled by electrical motors, via software, and even if there is some electrical or optical limit switch intended to prevent a short circuit, such switches and their control are not fail-safe. Any bug or disruption of the software, electrical wiring or connector contact during operation, may override said electrical or optical switch and create a short circuit between the probe and the center conductor. Only a mechanical stop, permanent or permanently adjusted, as part of the probe or the axis controlling the probe, will prevent this from happening.

RF tuner probes may comprise more than a single tuning section (FIGS. 16, 17) [5]; said probes are connected to a vertical axis (70) and, in case of more than one tuning section, are supported by mechanical structures (75, 76) allowing said probes to move together horizontally and vertically; mechanical means for preventing contact between said probes (72, 73, 74, 77, 78, 79, 80) and the center conductor (71) are also applicable either individually on each probe as shown in FIGS. 8, 10, 12 or on the common axis as shown in FIGS. 9, 11.

FIG. 18 illustrates an example of implementing mechanical means of contact prevention between said RF probes and center conductor of said slablines in multi-section probes. The horizontal bars (81, 82) are mounted permanently on said multi-section probe at a distance (83), such that said bar (81, 82) hits the top of said slabline before said probe makes contact with said center conductor as shown in FIG. 7. In FIG. 19 vertical screws (84, 85, 86, 87) can easily be inserted in the cross bars (81, 82) to make the mechanical limit adjustable, as shown in FIG. 10; dowel pins instead of screws can also be used as shown in FIG. 12. The same way such mechanical limitations in form of vertical screws or dowel pins can be introduced in other multi-section probe configurations as shown in FIG. 17 (subsets FIG. 8 or FIG. 10), or on the vertical axis (FIG. 9) limiting the vertical movement of the multi-section probes shown in FIG. 17.

FIG. 20 shows another possible implementation of permanent mechanical limit (87, 88) on the prior art multi-section probe (subset FIG. 8 in FIG. 17) [5].

Permanent and adjustable mechanical obstacles of vertical probe movement can be combined, as shown in FIG. 22; in this case a cross bar (91) built into the probe (20) and a vertical screw (21) attached to the vertical axis (22) are combined to allow a fine vertical adjustment (25) with the security that the vertical travel will never damage the center conductor, even if the fine adjustment has to be made such that temporary mechanical contact between probe and center conductor is at the limit of operation, as it often happens, when very high reflection factors are required and the probe must go very close to the center conductor. In this case the distance D2 must be chosen equal of marginally smaller than D. Combinations of all adjustable and permanent mechanical obstacles of vertical movement are easily imaginable.

FIG. 23 shows a vertically adjustable (25) mechanical obstacle (92) preventing contact between the probe (20) and the center conductor (19), said obstacle being mounted on the vertical axis (22) of the tuner; said obstacle (92) has the form of a 90 degree angle and is secured by a set screw (93) against the vertical axis (22).

Galvanic contact between "unprotected" probes and center conductor is not the actual condition limiting the tuner's operation. Such limitation, when the tuner is actually operating under DC and RF power, occurs earlier, at "non-zero" distance between probe and center conductor, in form of "Corona discharge" a well-known and understood physical phenomenon [8]. The electric field necessary to allow ionizing the air between probe and center conductor and electrical charges (electrons) to jump between charged electrical conductors is generally accepted to be approximately 2.5-4.0 MV/m (2.500,000 to 4,000,000 Volts/meter) or 2.5-4.0V/μm [9]. For distances of the order of a few micrometers (as can be found in the gap between the probe and center conductor in high reflection factor tuner operation, FIG. 5) the voltage required for Corona discharge is rather in the order a few tens of Volts: 40 Volts/10 μm or 160 Volts/40 μm; typical gaps used in such tuners in order to reach high reflection factors are between 30 and 100 μm (FIG. 5).

Depending on the horizontal position of the probe, for a constant distance to the center conductor, which corresponds to a constant reflection factor lrl, for a specific frequency, the created Voltage Standing Wave (VSWR) generates resistances whose Maximum to minimum ratio is Rmax/Rmin=VSWR$^2$, whereby VSWR=(1+|Γ|)/(1−|Γ|); this is all material known in basic literature [10]; also known is the relation between RF power ($P_{RF}$) and associated resistance: PRF=V*I; I=V/R (Ohm's law), therefore $P_{RF}$=V$^2$/R. As an example, a reflection |Γ|=0.9 results in VSWR=19:1, Rmin=2.6Ω (point 100 in FIG. 6), Rmax=950Ω (point 101 in FIG. 6); therefore the allowable gap between probe and center conductor (for the same voltage V which corresponds to the same electric field E=V/S, whereby "S" is the gap, changes by a factor of sqrt(Rmax/Rmin)=19; in short, whereas a gap of, for instance, 30 μm-point (500) in FIG. 5, would be enough for operating at a horizontal probe position corresponding to point (100) in FIG. 6, at another horizontal position of the probe, corresponding to point (101) and for the same RF power, a gap of approximately 570 μm-point (501) in FIG. 5, will be required to avoid Corona discharge. Combining the above relations, one can derive the following approximate equation determining the smallest gap "S" (FIG. 4) between the bottom of the probe and the center conductor of the slabline, for a given reflection factor lrl and a RF Power $P_{RF}$, necessary to avoid corona discharge: $S_{min}$≈sqrt((1+|Γ|)/(1−|Γ|)*Zo*$P_{RF}$)/Emax; hereby $S_{min}$ is the minimum gap, Zo the characteristic impedance of the slabline, typically 50Ω, and $E_{max}$ the breakdown electric field in air (typically 2.5-4V/μm).

As an example: for |Γ|=0.9 and $P_{RF}$=100 W, the minimum gap is 123 μm; for $P_{RF}$=10 W it is 39 μm; this conveys an idea of the actual dimensions and limits; all said numbers presented here are, of course, rather raw approximations, since corona discharge can be initiated prematurely if the opposed metallic surfaces are not perfectly parallel to each-other and comprise any edges and corners, which magnify the electric field.

It is more than obvious that such operation must be handled carefully; a method is proposed that allows preventing Corona discharge, and potential DUT and tuner damage, for a specific reflection factor and RF power handling by adjusting said limit screws (FIGS. 9 to 12, 19, 22 and 23) using the data shown in FIG. 5 and the above equations. The question the proposed method aims to reply and to find a possible solution for, is: "For the specific tuner and frequency, is an operation at a required reflection factor |Γ| and a required RF Power PRF possible, or not; and if "yes" how shall the probe limits be adjusted?"

Alternative configurations of the above tuner probes and limiting mechanisms are imaginable, but their effect will always be to introduce a fail-safe means for preventing electrical short between the probe and the center conductor. Said obvious variations, however, shall not impede on the validity and general coverage of the claims of the hereby described concept of using adjustable mechanical stops for preventing the probes in slide screw tuners from electrically shorting the probes.

What is claimed is:

1. A method for preventing electrical short in slide screw impedance tuners;
   said tuners having an input (test) port and an output (idle) port, a slotted airline (slabline) between said ports,
   and a mobile carriage travelling parallel to the axis of said slabline and having an adjustable vertical axis and a metallic tuning probe attached to said axis,
   said probe having a concave bottom surface matching axially the round center conductor of said slabline,
     and being insertable vertically into the slot of said airline,
     and being movable both vertically, towards said center conductor, and horizontally, parallel to the axis of said slabline;
   and at least one adjustable vertical limit screw, attached to said vertical axis or probe and limiting said probe's movement towards said center conductor;
   said method comprising two steps:
     a) in a first step the smallest gap between the bottom surface of said metallic tuning probe and said center conductor of the slabline of said tuner is determined, for safe (non electrically-shorted) operation, and
     b) in a second step said limit screw(s) is (are) adjusted in order to prevent the tuning probe from approaching said center conductor closer than said gap.

2. A method for determining the closest safe gap between the metallic tuning probe and the center conductor, as in claim 1, comprising the following steps:
   a) the minimum gap $S_{min}$ between probe and center conductor for a required reflection factor |Γo| and an RF power $P_{RF}$ is estimated using the relation: $S_{min}$[μm]≈sqrt ((1+|Γo|)/(1−|Γo|)*Zo[Ω]*$P_{RF}$[Watt])/$E_{max}$[V/μm], whereby the Corona breakdown electric field in air $E_{max}$ is, approximately, 2.5-4V/μm, Zo is typically 50Ω, and whereby for safest operation (largest $S_{min}$) a typical value of $E_{max}$=2.5V/μm shall be used;
   b) the reflection factor of the tuner is measured at the test port as a function of the distance (gap) between the bottom of said probe and said center conductor;
   c) the relationship between reflection factor |Γ| and distance between probe and center conductor S is established: |Γ|=Function(S);
   d) the relations in steps a) and c) are used to establish if for a given |Γo| and $P_{RF}$ the resulting $S_{min}$ satisfies the relationship |Γ|=Function(S) determined in step c);
   e) if |Γ|($S_{min}$)<|Γo| then the tuner operation is unsafe and either $P_{RF}$ or |Γo| or both must be reduced and continue with step a);
   f) if |Γ|($S_{min}$)>|Γo| then the tuner operation is safe and $S_{min}$ is defined as the minimum safe gap between probe and center conductor.

3. A method for adjusting the limit of the vertical travel of the tuning probe towards the center conductor, in a tuner as in claim 2, whereas said probe has no dielectric protection on its bottom surface, comprising the following steps:
   a) the tuner probe is moved towards the center conductor and the electrical resistance is measured between said center conductor and probe axis;
   b) the probe position at which a galvanic contact of said probe with the center conductor occurs is marked as "vertical zero";
   c) the limit screw is adjusted to touch the top of the sidewall of the slabline (FIGS. 9 to 12, 22 and 23);
   d) the probe is withdrawn from the slabline;
   e) the vertical limit screw is lowered by the length $S_{min}$, as determined in claim 2, and fastened.

4. A method for adjusting the limit of the travel of the tuning probe towards the center conductor, in a tuner as in claim 2, whereas said probe has dielectric protection on its bottom surface, comprising the following steps:
- a) the tuner probe is moved towards the center conductor and the reflection factor is measured at the tuner test port using a calibrated network analyzer;
- b) the probe position at which said reflection factor jumps to values close to 1 is marked as "vertical zero";
- c) the limit screw is adjusted to touch the top of the sidewall of the slabline (FIGS. 9 to 12, 22 and 23);
- d) the probe is withdrawn from the slabline;
- e) the vertical limit screw is lowered by the length $S_{min}$, as determined in claim 2, and fastened.

\* \* \* \* \*